United States Patent
Rimmer et al.

(10) Patent No.: US 9,023,765 B1
(45) Date of Patent: May 5, 2015

(54) ADDITIVE MANUFACTURING METHOD FOR SRF COMPONENTS OF VARIOUS GEOMETRIES

(71) Applicant: Jefferson Science Associates, LLC, Newport News, VA (US)

(72) Inventors: Robert Rimmer, Yorktown, VA (US); Pedro E. Frigola, Culver City, CA (US); Alex Y. Murokh, Encino, CA (US)

(73) Assignee: Jefferson Science Associates, LLC, Newport News, VA (US)

( * ) Notice: Subject to any disclaimer, the term of this patent is extended or adjusted under 35 U.S.C. 154(b) by 0 days.

(21) Appl. No.: 14/169,193

(22) Filed: Jan. 31, 2014

(51) Int. Cl.
*H01L 39/24* (2006.01)
*H01P 7/06* (2006.01)
*H01P 11/00* (2006.01)

(52) U.S. Cl.
CPC .......... *H01L 39/2406* (2013.01); *H01L 39/249* (2013.01); *H01P 7/06* (2013.01); *H01P 11/008* (2013.01); *H01L 39/2419* (2013.01)

(58) Field of Classification Search
CPC .............. H01L 39/2419; C04B 35/653; C04B 35/4508; C04B 35/4521
See application file for complete search history.

(56) References Cited

U.S. PATENT DOCUMENTS

| | | | | |
|---|---|---|---|---|
| 4,927,992 A | * | 5/1990 | Whitlow et al. | 219/121.65 |
| 5,707,419 A | * | 1/1998 | Tsantrizos et al. | 75/336 |
| 7,648,740 B2 | * | 1/2010 | Slaughter | 427/551 |
| 8,461,474 B2 | * | 6/2013 | Wollenhaupt et al. | 219/121.14 |

* cited by examiner

*Primary Examiner* — Colleen Dunn

(57) ABSTRACT

An additive manufacturing method for forming nearly monolithic SRF niobium cavities and end group components of arbitrary shape with features such as optimized wall thickness and integral stiffeners, greatly reducing the cost and technical variability of conventional cavity construction. The additive manufacturing method for forming an SRF cavity, includes atomizing niobium to form a niobium powder, feeding the niobium powder into an electron beam melter under a vacuum, melting the niobium powder under a vacuum in the electron beam melter to form an SRF cavity; and polishing the inside surface of the SRF cavity.

18 Claims, 4 Drawing Sheets

ADDITIVE MANUFACTURING METHOD FOR SRF COMPONENTS OF VARIOUS GEOMETRIES

The United States Government may have certain rights to this invention under Management and Operating Contract No. DE-AC05-06OR23177 from the Department of Energy.

FIELD OF THE INVENTION

The present invention relates to a superconducting radio frequency (SRF) particle accelerating structure formed from niobium (Nb) and/or niobium alloys or other suitable metallic superconducting materials, more particularly to an improved method for manufacturing complex, monolithic SRF structures, with optimized mechanical and RF designs.

BACKGROUND OF THE INVENTION

Superconducting Radio-Frequency (SRF) accelerating cavities are commonly used in accelerators. Due to their very small RF losses, much higher acceleration efficiencies, and higher continuous wave (CW) accelerating fields than normal conducting cavities, SRF cavities are now considered the device of choice for many of today's leading applications in high energy and nuclear physics, including energy recovery linacs (ERLs), linear colliders, neutrino factories, spallation neutron sources, and rare isotope accelerators. These projects place enormous demands not only on advances in beam performance, but also on more reliable and economic methods for fabrication, assembly, and operation.

The mechanical stability of an SRF cavity is a fundamental consideration in its design. Conventional SRF cavities, as a result of being constructed from metal plates, typically include a uniform wall thickness. During operation, SRF cavity walls are subject to number of forces. Of particular importance are deformations due to the Lorentz radiation pressure acting on the cavity walls, the liquid helium pressure, and the atmospheric pressure after pump down. These deformations can shift the resonant frequency, reduce field flatness, and lead to an unwanted stress distribution in the cavity. Lorentz force deformation can be a particularly difficult problem to address in the case of cavities with low β values, which have steep and flat-sided walls. The radiation pressure acting on the cavity is a function of the surface electric and magnetic fields. The Lorentz pressures are not uniformly distributed on the cavity walls as can be seen in FIG. 1.

In areas near the iris, where the electric field is highest, the Lorentz pressure acts inward, while in areas near the outer diameter, where magnetic fields dominate, it acts outward. A common practice to mitigate this problem is to use stiffener rings and other stabilizing structures welded on to the cavities. These stabilizing structures, however, introduce variability, add complexity, and cannot always be ideally placed.

Currently the construction of SRF accelerating cavities requires the use of many complex and expensive techniques to fabricate, assemble, and operate. SRF accelerating cavities are the technology of choice for many of the leading accelerator facilities in the U.S. and abroad. These projects, more than ever, are placing enormous demands on the development of more reliable and economic methods for fabricating SRF accelerating cavities and ancillary components.

Thus, the development of less-expensive, more reliable superconducting RF structures is highly desirable in the construction of SRF cavities. What is needed is a method for manufacturing SRF cavities wherein the wall thickness is designed to better withstand the Lorentz pressures, i.e., the wall of the SRF cavity is made thicker in those areas that are subject to higher Lorentz pressures and thinner in in those areas that are subject to lower Lorentz pressures. A method for constructing an SRF cavity in this manner will dramatically mitigate the effect of microphonics, and provide a cavity with an RF optimized geometry including highly tailored wall thicknesses, optimized to counteract Lorentz force detuning. The method will enable the incorporation of SRF cavities with mechanically optimized wall thicknesses, and the inclusion of stiffening structures integral with the SRF cavity.

BRIEF SUMMARY OF THE INVENTION

The present invention is an additive manufacturing method for forming nearly monolithic SRF niobium cavities and end group components of arbitrary shape with features such as optimized wall thickness and integral stiffeners, greatly reducing the cost and technical variability of conventional cavity construction. The additive manufacturing method for forming an SRF cavity, includes atomizing niobium to form a niobium powder, feeding the niobium powder into an electron beam melter under a vacuum, melting the niobium powder under a vacuum in the electron beam melter to form an SRF cavity; and polishing the inside surface of the SRF cavity.

OBJECTS AND ADVANTAGES

The present invention makes use of Additive Manufacturing and Electron Beam Melting (EBM) technology to fabricate SRF structures from fully-dense metals layer-by-layer using 3D computer aided design (CAD) data. The novel use of AM techniques in the fabrication of SRF cavities offers advantages in the speed of development, cost savings, and performance enhancement. These advantages include:
  Rapid production of near net shape and seamless SRF accelerating cavities from fully-dense metals.
  Fabrication of monolithic, complex structures such as end group components and High Order Mode (HOM) dampers.
  Significant reduction in the number of welds/seams, and nearly monolithic structures.
  Integral cavity stiffening supports.
  Optimized wall thickness to control cavity deformation and improve thermal conductance. The wall of the SRF cavity can be made thicker at the iris and at the outer diameter to withstand the higher Lorentz pressures in those areas.
  Integral internal passages for cryogenic cooling of critical structures.
  Rapid development, reducing the time required to design, fabricate, and test new structures.
  The method enables mass production of SRF cavities and end group components of arbitrary shape.
  The elimination of forming dies and other shaping fixtures and tooling, which account for a significant portion of the cost of SRF cavities.

BRIEF DESCRIPTION OF THE DRAWINGS

Reference is made herein to the accompanying drawings, which are not necessarily drawn to scale, and wherein.

DETAILED DESCRIPTION

The current invention is an additive manufacturing method for forming an SRF cavity. The Additive Manufacturing (AM) method of the present invention makes possible the design and production of near net shape, seamless, niobium structures for the next generation of SRF accelerating cavities. RF, mechanical, and thermal-management optimized geometries could be fully realized without the usual complexity and expense of current SRF fabrication techniques. The additive manufacturing method described herein makes it possible to produce monolithic and mechanically robust SRF structures faster and cheaper than ever before.

The additive manufacturing method for forming an SRF cavity includes preparation of a niobium powder in a vacuum and feeding the niobium powder into an electron beam melter under a vacuum. An electron beam melter, such as Arcam's CAD TO METAL® EBM, available from ARCAM AB COMPANY SWEDEN, Goteborg, Sweden, employ so-called rapid prototyping layer methods to allow virtually any geometry to be physically constructed.

AM or rapid prototyping refer to a group of techniques used to quickly fabricate a part layer-by-layer using 3D computer aided design (CAD) data. These techniques are common today throughout industry, providing a quick and accurate way for designers and engineers to visualize, optimize, and fabricate parts directly from CAD models. However, until recently, these methods have been primarily used to produce parts made from either thermoplastics or special sintered (not fully-dense) metals. The AM method of the present invention enables production of niobium SRF components with properties similar to or better than those of wrought materials.

For the fabrication of SRF cavities, the AM method of the present invention offers tremendous advantages in the speed of development, cost savings, and performance enhancement.

End group components, including Fundamental Power Couplers (FPC) and HOM dampers, represent a significant portion of the complete SRF accelerating structure design effort. These structures, due in part to the added stresses resulting from thermal gradients near the end of the cryostat, often require a high concentration of weld joints, significantly adding to their complexity. The AM method of the present invention enable the design and fabrication of nearly monolithic end group structures, greatly reducing the number of potential failure points, and integrate thermal management at a level not found in current technology.

The AM method of the present invention further requires polishing the inside of said SRF cavity to produce the necessary surface finish required for high gradient operation. Thus, the inside of the SRF structure must be post-processed after the EBM AM process to improve its surface finish.

Figure 1:
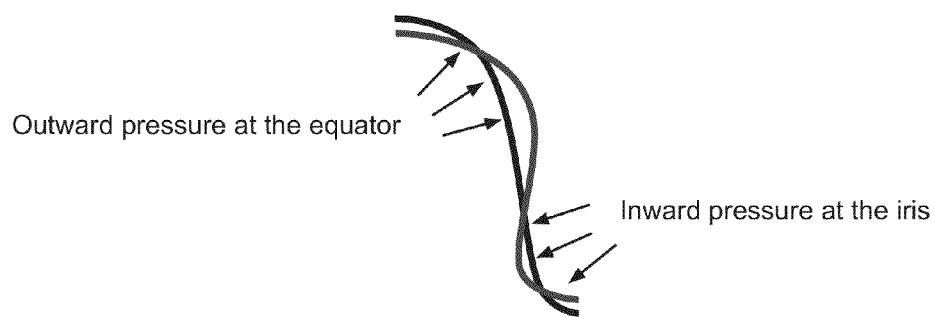
FIG. 1 is a schematic demonstrating the distribution of Lorentz pressures on an SRF cavity wall.
Figure 2:
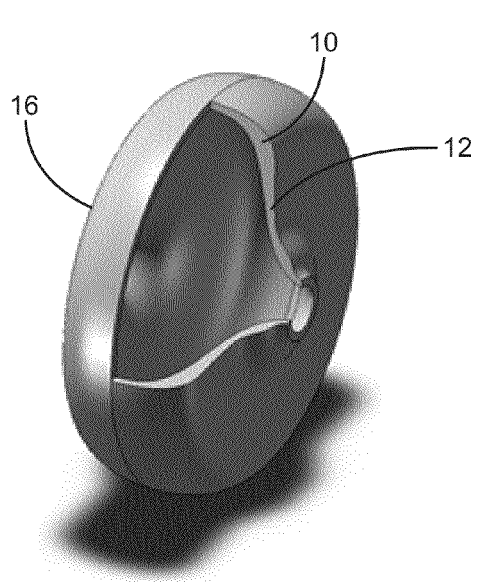
FIG. 2 is an isometric view of an SRF cavity formed according to the present invention and with a portion cut away to depict the cavity walls.
Figure 3:
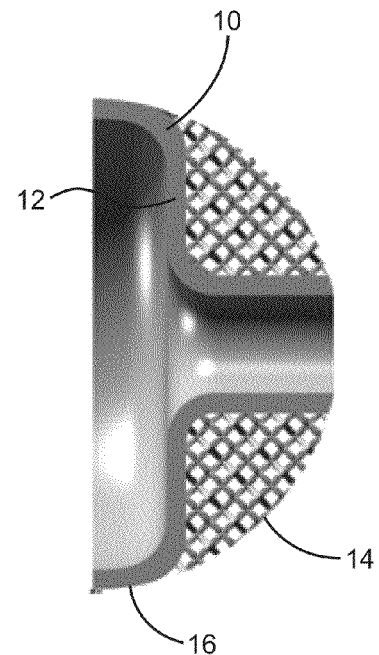
FIG. 3 is a sectional view of an SRF cavity including an integral stiffening lattice according to the present invention.

As depicted in FIGS. 2 and 3, the AM method of the present invention will enable optimized design of prototype SRF cavities, such as mechanically optimized walls including thick wall sections 10 and thin wall sections 12, and the inclusion of stiffening structures 14 integral with the SRF cavity 16.

Additional applications of the technology being developed in this proposal include high temperature niobium components for rocket engine thrusters and other components that require the use of refractory metal alloys.

Several features of additive manufacturing method for forming an SRF cavity are critical to the construction of niobium SRF cavities. The use of an electron beam to melt the powder, as opposed to a laser used in other systems, makes it significantly more energy efficient when processing highly reflective or refractory metals. The lightly sintered powder serves as a support for subsequent layers, allowing for the generation of unsupported complex shapes with downward facing geometries, critical for the formation of lattice support structures. The electron beam melts the powdered metal in a vacuum, thereby providing a clean environment and resulting in superior material characteristics for the SRF cavity.

Figure 4:
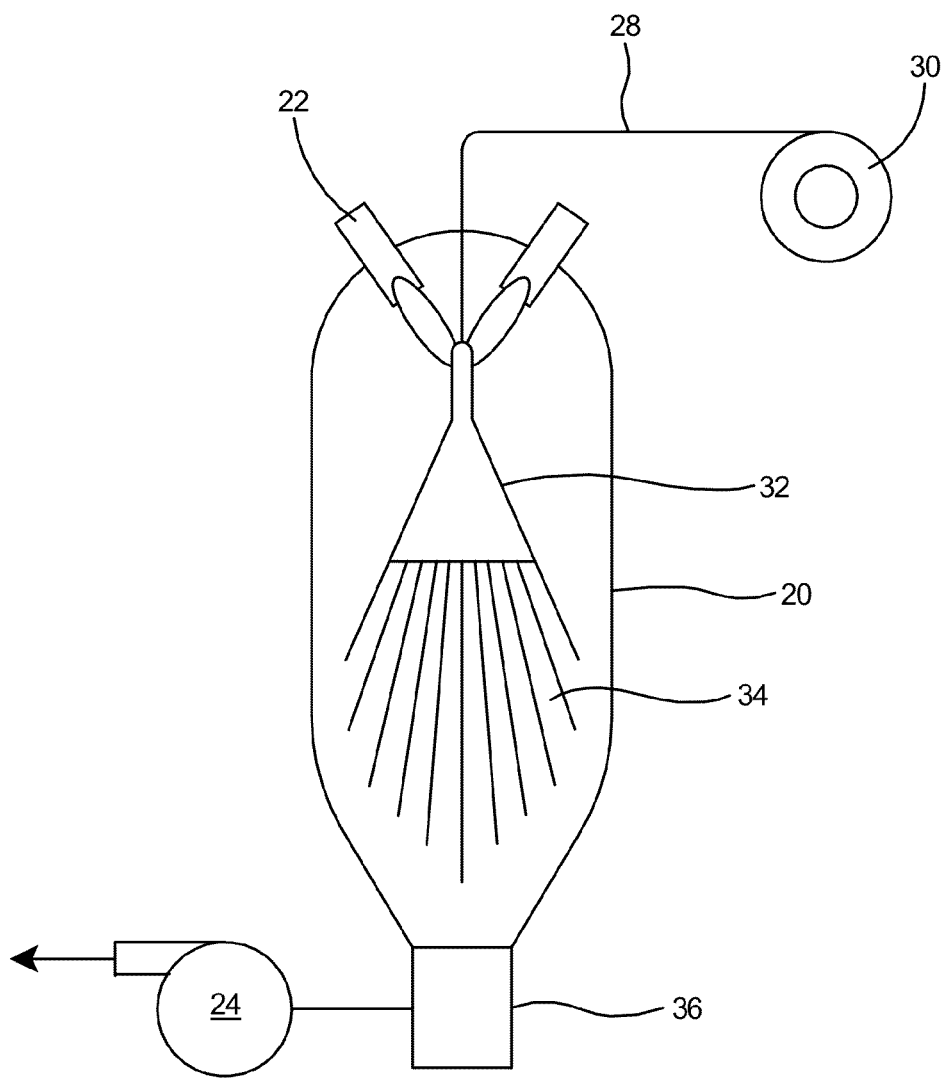
FIG. 4 is a schematic of a plasma atomization process that forms a portion of the additive manufacturing method of the present invention.

A critical step in the method of the present invention is the preparation of the feed powder. Of particular importance to SRF applications is the quality of the niobium feedstock, and maintaining material quality throughout the EBM process. With reference to FIG. 4, plasma atomization is used to provide a high yield of powdered niobium in the size range suitable for electron beam melting, and produces a spherical powder geometry leading to very good flowability and density. Additionally the lack of crucible or nozzle in the melting process, and use of argon atmosphere in the atomization process, maintains the high purity of the feedstock material.

As shown in FIG. 4, the atomization process includes an atomization vessel 20 with one or more plasma torches 22 therein. A vacuum pump 24 maintains a vacuum within the atomization vessel 20. A metal niobium wire 28 is fed from a spool 30 through the plasma 32 and is converted into niobium powder 34. The niobium powder is collected in a powder collection chamber 36 at the bottom of the atomization vessel.

The powder feedstock used to construct EBM niobium components for SRF applications must exhibit: high purity (>99.99%), very low surface contamination, such as oxides and nitrides, and be available in sufficient quantities and at reasonable prices. Additional restrictions, imposed by the EBM process, include a powder size distribution of +30 μm to −100 μm, and a spheroidal morphology. In the present invention, niobium powder is manufactured by a plasma atomization process, where a thin niobium wire is atomized, or melted and converted to droplets, in a vacuum under an inert gas atmosphere. Preferably the plasma is argon plasma. All powder from the atomization process is transported in a sealed container in an argon atmosphere to minimize oxidation of the powder.

Figure 5:
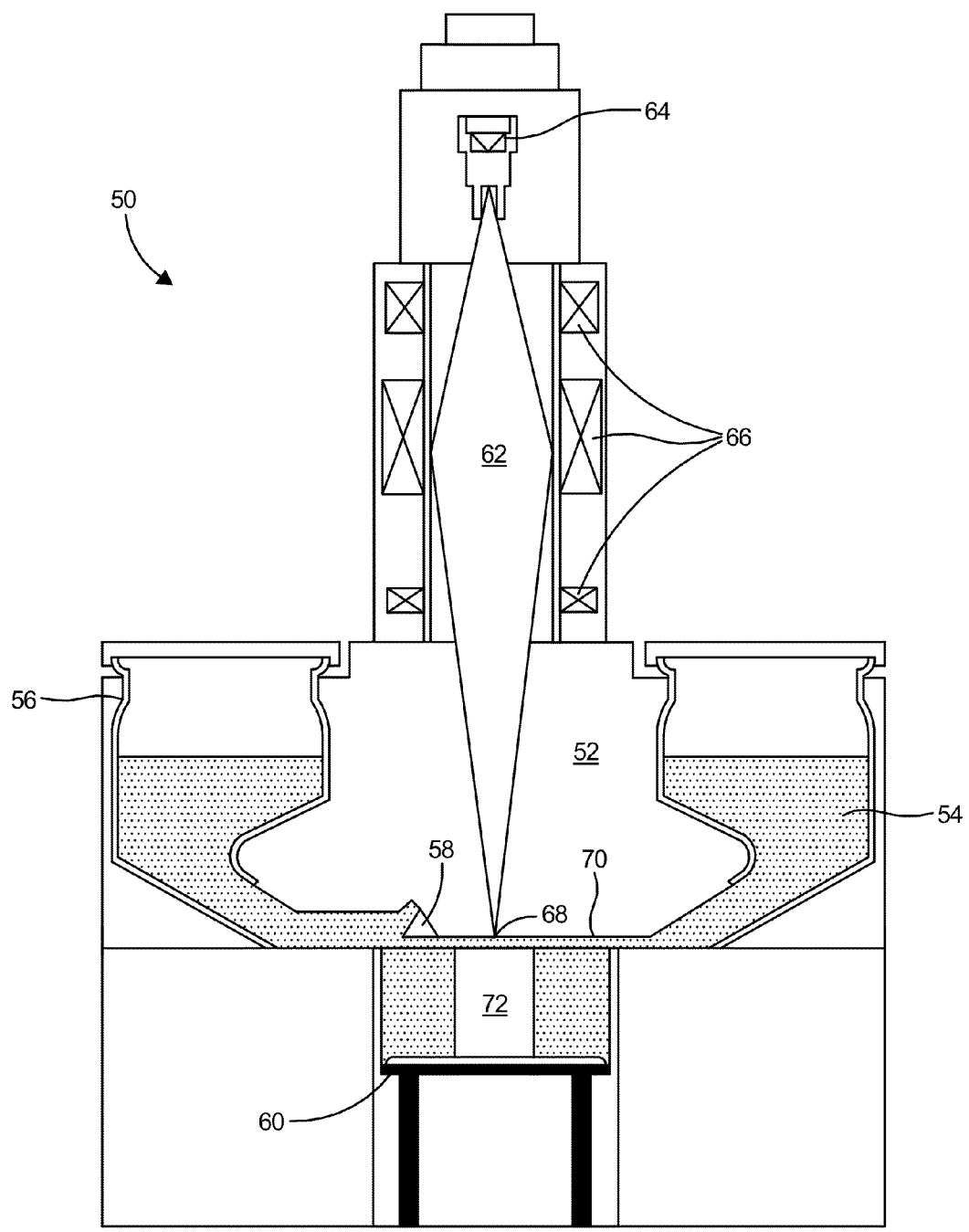
FIG. 5 is a schematic of an electron beam melter that forms a portion of the additive manufacturing method of the present invention.

Referring to FIG. 5, the electron beam melter 50 includes a build chamber 52. Prior to the introduction of a new material, the build chamber 52 is disassembled and thoroughly cleaned of any residue from previous runs. Powdered niobium metal 54 is deposited into two stainless steel hoppers 56. The build chamber 52 is then sealed and evacuated, preferably to between $10^{-5}$ and $10^{-6}$ Torr. The powder 54 in the hoppers 56 is gravity fed and raked by rake 58 over a vertically adjustable surface 60. An electron beam 62 is generated by a thermionic gun 64 across an accelerating voltage of 60 kV and is manipulated by steering and focusing optics 66. The focused electron beam 68 pre-heats the entire raked powder layer 70, which is preferably 100 μm thick, with a low beam current and high scan speed. This step serves two important purposes. One, it lightly sinters the powder allowing it to hold firm during subsequent melting. Two, by imparting heat to the part; it helps reduce thermal gradients between the melted layer and the rest of the part 72. After the preheating is complete, the electron beam current is increased and/or the scan speed decreased. A computer-aided design (CAD) program guides the electron beam and traces the cross section of the modeled part 72, thus melting and forming the first layer. The vertically adjustable surface 60, on which the modeled part is built, is then lowered and the process repeated for each successive layer.

High RRR (residual resistivity ratio) niobium powder is typically refined in electron beam melters with significantly better vacuum, preferably between $10^{-5}$ to $10^{-6}$ Torr, than similar fully dense metals in order to remove interstitial impurities from the niobium. Lower pressures can be achieved in the EBM by increasing pumping speed and effectively baking-out the build chamber, thereby reducing oxygen content and other impurities. Alternatively, a gas can be introduced into the build chamber of the EBM. As an example, small amounts of helium gas can be introduced into the build chamber to stabilize the fabrication of nonconductive material. Alternatively, a small amount of hydrogen could be injected into the powder reservoir to create a reducing atmosphere. Material purity is a key component in minimizing surface defects and thereby achieving the required performance for SRF applications. Reactor grade unalloyed niobium powder with an RRR value of at least 30 may be used to construct an SRF cavity according to the AM method of the present invention. Although this low-grade niobium is not ideally suited for cavity fabrication, the lower price and availability make it particularly attractive for fabrication by the electron beam melter. The difference in purity (RRR) between the low-grade and high-grade Nb (RRR>300) is insignificant as far as EBM processing parameters are concern, where powder size and shape play larger roles than purity. The EBM process parameters for the high-grade Nb have been found to be virtually identical to the EBM process parameters for the low-grade Nb material. Preferably, niobium powder for forming an SRF cavity according to the present invention includes a residual resistivity ratio (RRR) of at least 300.

The walls of conventional SRF cavities, as a result of being formed from Nb plate material, are limited to a single wall thickness. The AM method of the present invention enables the formation of SRF cavities having a variable wall thickness, wherein the wall thickness can be optimized to control cavity deformation and improve thermal conductance. The AM method enables walls of the SRF cavity to be made thicker at the iris and at the outer diameter to withstand the higher Lorentz pressures in those areas.

Although the electron beam melting process has been developed for pure Ti and two Ti alloys. Titanium parts processed with these parameters have been shown to give fully dense parts with material properties better than cast and comparable to the wrought material, and are currently being explored for use in aerospace and medical applications. Although there are material similarities between Ti and Nb, EBM process parameters are extremely difficult to predict since even the shape of the particles can significantly affect the thermal/electrical conductivity and the melt flow behavior.

After forming the SRF cavity on the electron beam melter, the inside of the SRF cavity, which typically includes a surface finish of 25-25 Ra, is preferably polished. The desired surface finish for the inside surface of the SRF cavity can be achieved by Electro-polishing (EP), or Plasma Polishing (PP), or Centrifugal Barrel Polishing (CBP).

CBP is a process that mechanically polishes the inside of SRF cavities using abrasive media by rotating the cavity at high speed. The CBP process produces excellent (tens of nm) surface finishes in elliptical niobium cavities, removing hundreds of microns of material in a matter of hours. CBP polishes the surface finish to the 100 nm level or less, followed by standard baseline processes (light chemistry, high pressure rinsing, bake, etc.) is currently considered the preferred option to produce monolithic, cylindrically symmetric components using EBM.

EXAMPLE

Figure 6:
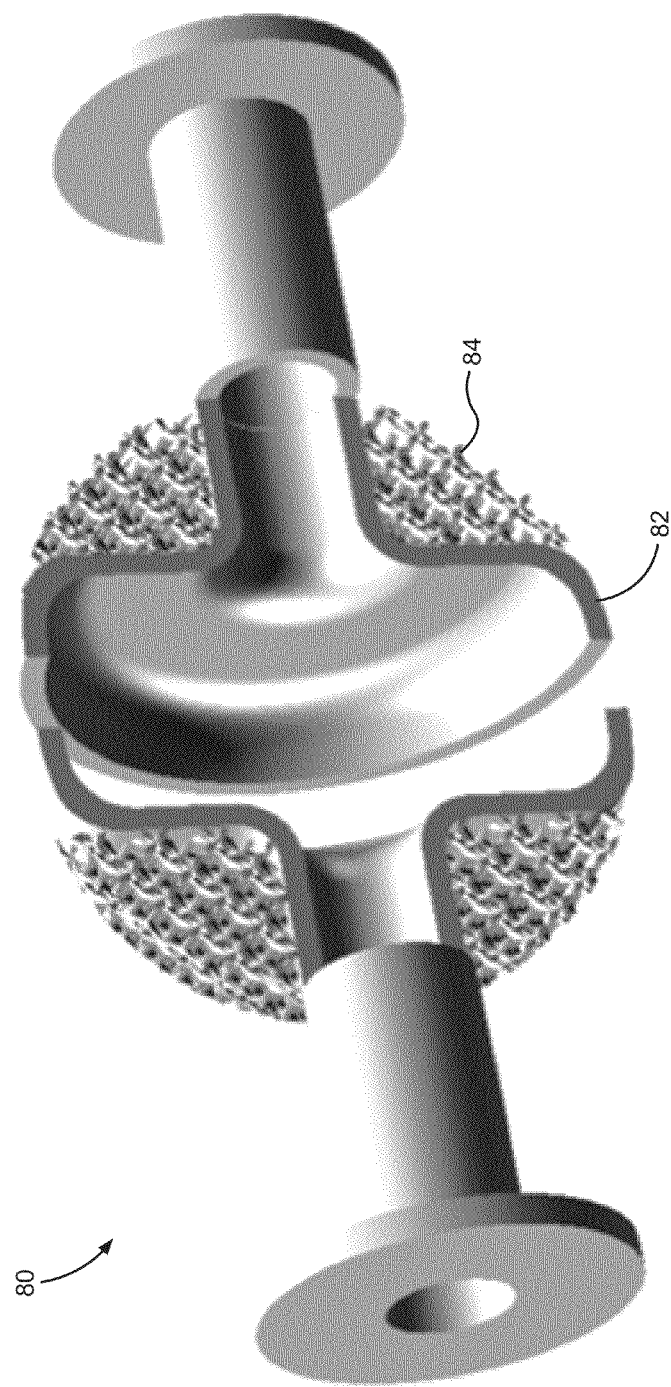
FIG. 6 is an isometric sectional view of an SRF cavity according to the present invention.

With reference to FIG. 6, there is shown a niobium SRF cavity produced by the additive manufacturing method of the present invention. The 2.3 GHz, Low-Loss (LL) type single cell SRF cavity 80 includes a monolithic body 82 with integral stiffening supports 84. The integral stiffening supports are particularly advantageous for the Low-Loss design due to its flat walls and weak cell to cell coupling, which make it particularly sensitive to Lorentz pressure detuning. The additive manufacturing method avoids an equator weld and any welds due to the stiffening rings, and associated heat affect zones, which can negatively affect the performance of conventional SRF cells.

The additive manufacturing method for forming an SRF cavity according to the present invention includes:
1) atomizing a thin niobium wire in a vacuum under an inert gas atmosphere to form a niobium powder;
2) maintaining said niobium powder in a sealed container in a vacuum under a blanket of inert gas;
3) feeding said niobium powder into the electron beam melter under vacuum;
4) raking the niobium powder over the vertically adjustable surface to form a powder layer;
5) melting the niobium powder under a vacuum in the electron beam melter to form a cross-section of the SRF cavity;
6) lowering said vertically adjustable surface;
7) repeating steps 4) through 7) to form additional cross-sections of the SRF cavity; and
8) polishing the inside of the SRF cavity.

Although the description above contains many specific descriptions, materials, and dimensions, these should not be construed as limiting the scope of the invention but as merely providing illustrations of some of the presently preferred embodiments of this invention. Thus the scope of the invention should be determined by the appended claims and their legal equivalents, rather than by the examples given.

What is claimed is:

1. An additive manufacturing method for forming a superconducting radio frequency (SRF) cavity, comprising:
   a) atomizing a thin niobium wire in a vacuum under an inert gas atmosphere to form a niobium powder;
   b) maintaining said niobium powder in a sealed container in a vacuum under a blanket of inert gas;
   c) feeding said niobium powder into the electron beam melter under vacuum;
   d) raking the niobium powder over the vertically adjustable surface to form a powder layer;
   e) melting the niobium powder under a vacuum in the electron beam melter to form a cross-section of the SRF cavity;
   f) lowering said vertically adjustable surface;
   g) repeating steps c through f to form additional cross-sections of the SRF cavity; and
   h) polishing the inside of the SRF cavity.

2. The method of claim 1 wherein said niobium powder includes a residual resistivity ratio (RRR) of at least 300.

3. The method of claim 1 wherein said niobium powder includes a purity of greater than 99.99%.

4. The method of claim 1 wherein said niobium powder includes a powder size distribution of +30 μm to −100 μm.

5. The method of claim 1 wherein said niobium powder includes a spheroidal morphology.

6. The method of claim 1 wherein said inert gas is argon.

7. The method of claim 1 wherein the vacuum in said electron beam melter is between $10^{-5}$ and $10^{-6}$ Torr.

8. The method of claim 1 wherein said SFR cavity is of monolithic construction.

9. The method of claim 1 wherein said SFR cavity includes a wall and an integral stiffener extending from said wall.

10. The method of claim 9 wherein said integral stiffener is a honeycomb structure.

11. The method of claim 1 wherein the powder layer includes a thickness of 100 μm.

12. The method of claim 11 wherein said polishing the inside of said SRF cavity includes abrasive media.

13. The method of claim 12 wherein said polishing the inside of said SRF cavity includes rotating the cavity at high speed.

14. The method of claim 1 wherein the inside of said SRF cavity is polished to a surface finish of 100 nm or less.

15. The method of claim 9 wherein said wall of said SRF cavity includes a variable wall thickness.

16. The method of claim 1 wherein the atomizing includes melting and converting said thin niobium wire to droplets in a plasma.

17. The method of claim 16 wherein the plasma is an argon plasma.

18. The method of claim 1 wherein melting the niobium powder includes
   pre-heating the powder layer with the focused electron beam at low beam current and high scan speed; and
   increasing the beam current and decreasing the scan speed of the focused electron beam as needed to melt the powder layer.

* * * * *